United States Patent [19]

Fujishima et al.

[11] Patent Number: 5,111,386
[45] Date of Patent: May 5, 1992

[54] CACHE CONTAINED TYPE SEMICONDUCTOR MEMORY DEVICE AND OPERATING METHOD THEREFOR

[75] Inventors: Kazuyasu Fujishima, Hyogo, Japan; Charles A. Hart, San Jose, Calif.

[73] Assignee: Mitsubishi Denki Kabushiki Kaisha, Tokyo, Japan

[21] Appl. No.: 538,605

[22] Filed: Jun. 14, 1990

Related U.S. Application Data

[63] Continuation of Ser. No. 266,060, Nov. 2, 1988, abandoned.

[30] Foreign Application Priority Data

Dec. 2, 1987 [JP] Japan .................................. 62-306101

[51] Int. Cl.⁵ .......................... G06F 12/00; G06F 7/00; G11C 8/00
[52] U.S. Cl. ..................................... 395/425; 365/49; 365/189.05; 365/230.03; 364/DIG. 1
[58] Field of Search .................. 364/200, 900; 365/49, 365/189.05, 234.03

[56] References Cited

U.S. PATENT DOCUMENTS

| | | | |
|---|---|---|---|
| 4,330,852 | 5/1982 | Redwine et al. | |
| 4,577,293 | 3/1986 | Matick et al. | 365/189 |
| 4,725,945 | 2/1988 | Kronstadt et al. | 364/200 |
| 4,811,209 | 3/1989 | Rubenstein | 364/200 |
| 4,901,228 | 2/1990 | Kodama | 364/200 |

OTHER PUBLICATIONS

Asakura et al., "An Experimental 1Mb Cache DRAM with ECC", 1989 *Symposium on VLSI Circuits* (May 25-27, 1989), pp. 43-44.
Asakura et al., "An Experimental 1-Mbit Cache DRAM with ECC", *IEEE Journal of Solid-State Circuits*, vol. 25, No. 1 (Feb. 1990), pp. 5-10.
Hidaka et al., "The Cache DRAM Architecture: A DRAM with an On-Chip Cache Memory", *IEEE Micro* (Apr. 1990) pp. 15-24.
"Computer Group News", p. 11, FIG. 4.
J. R. Goodman et al., "The Use of Static Column RAM as a Memory Heirarchy" *IEEE* 1984, pp. 167-174.
"CHMOS DRAMS-A New Memory Alternative for Digital Processing Applications" pp. 1-276-1-279.
Raymond Pinkham et al., "A High Speed Dual Port Memory with Simultaneous Serial and Random Mode Access for Video Application" *IEEE* 1984, vol. SC-19, No. 6, Dec. 1984.

*Primary Examiner*—Alyssa H. Bowler
*Attorney, Agent, or Firm*—Lowe, Price, LeBlanc & Becker

[57] ABSTRACT

A dynamic random access memory with a fast serial access mode for use in a simple cache system includes a plurality of memory cell blocks prepared by division of a memory cell array, a plurality of data latches each provided for each column in the memory cell blocks and a block selector. When a cache miss signal is produced by the cache system, data on the column in the cell block selected by the block decoder are transferred into the data latches provided for the columns in the selected block after selection. When a cache hit signal is produced by the cache system, the data latches are isolated from the memory cell array. Accessing is made to at least one of the data latches based on an externally applied column address on cache hit, and to at least one of the columns in the selected block based on the column address on cache miss.

10 Claims, 7 Drawing Sheets

FIG.3 PRIOR ART
PAGE MODE

FIG.4 PRIOR ART
STATIC COLUMN MODE

CACHE CONTAINED TYPE SEMICONDUCTOR MEMORY DEVICE AND OPERATING METHOD THEREFOR

This application is a Continuation; application of application Ser. No. 07/266,060, filed Nov. 2, 1988, now abandoned.

BACKGROUND OF THE INVENTION

1. Field of the Invention

The present invention relates generally to a semiconductor memory device, and more particularly, to a structure of a semiconductor memory device containing a cache memory having an improved cache hit rate in a simple configuration and an operating method therefor.

2. Description of the Prior Art

A computer system generally comprises a central processing unit (CPU) for executing applied instructions and a main memory for storing data, programs or the like which the CPU requires. From the point of view of improvement in system performance, it is desirable to operate the CPU at high speed and with no wait. Thus, the access time to the main memory must be made as short as possible, to be a value corresponding to the operating speed of the CPU. However, when as in recent years, a clock cycle of the CPU becomes short, for example, from 16MHz to 20MHz, it is necessarily requested to shorten the access time to the main memory. However, this request has exceeded the performance of a DRAM (dynamic random access memory) used as the main memory. In order to cope with this, a high-speed memory is required, which is expensive. Thus, the high-speed memory is not desirable in terms of cost performance. One method for solving this problem uses the approach of structuring a memory in a hierarchy, which is referred to as a cache memory system. In this system, a low-speed and large capacity and thus low-cost DRAM is employed as the main memory, and a small capacity but high-speed buffer memory is provided between the CPU and the low-speed main memory. Frequently used data in the main memory is stored in the high-speed buffer memory in response to a request from the CPU. In response to access from the CPU, requested data is read out/written from/to the high-speed buffer memory in place of the main memory. This high-speed buffer memory is referred to as a cache memory. The state in which data in an address which the CPU attempts to access exist in the cache memory is referred to as "hit". In this case, the CPU accesses the high-speed cache memory. On the other hand, the state in which data in an address which the CPU attempts to access do not exist in the cache memory is referred to as "miss hit". In this case, the CPU makes access to the low-speed main memory, as well as transfers a block to which the requested data belongs from the main memory to the cache memory. The cache memory stores the block of these transferred data, to prepare for the next access from the CPU.

As described above, the cache memory does not store fixed data. A data region of the main memory stored in the cache memory changes in response to a request from the CPU. However, a region in the main memory to be accessed by the CPU has locality in a data processing. Thus, there is a high possibility that data extracted from the main memory in response to the request from the CPU and stored in the cache memory is accessed for a certain time period. Thus, when data in the main memory is once stored in the cache memory, the effect of the high-speed memory is fully developed, so that no wait in access of the CPU to the memory is achieved. More specifically, a processing operation of the CPU is not delayed depending on the access time to the memory.

As described above, the high-speed cache memory is provided as a buffer between the low-speed and large capacity main memory and the high-speed CPU, so that system performance and cost performance are improved. However, the above described cache memory system, the capacity of which is small, requires an expensive high-speed memory. Therefore, in a small-sized system attaching importance to the cost, the cache memory system could not be applied.

In the conventional small-sized system, a simple cache system has been achieved utilizing a fast access mode of a general-purpose DRAM, i.e., a page mode and a static column mode.

Figure 1:
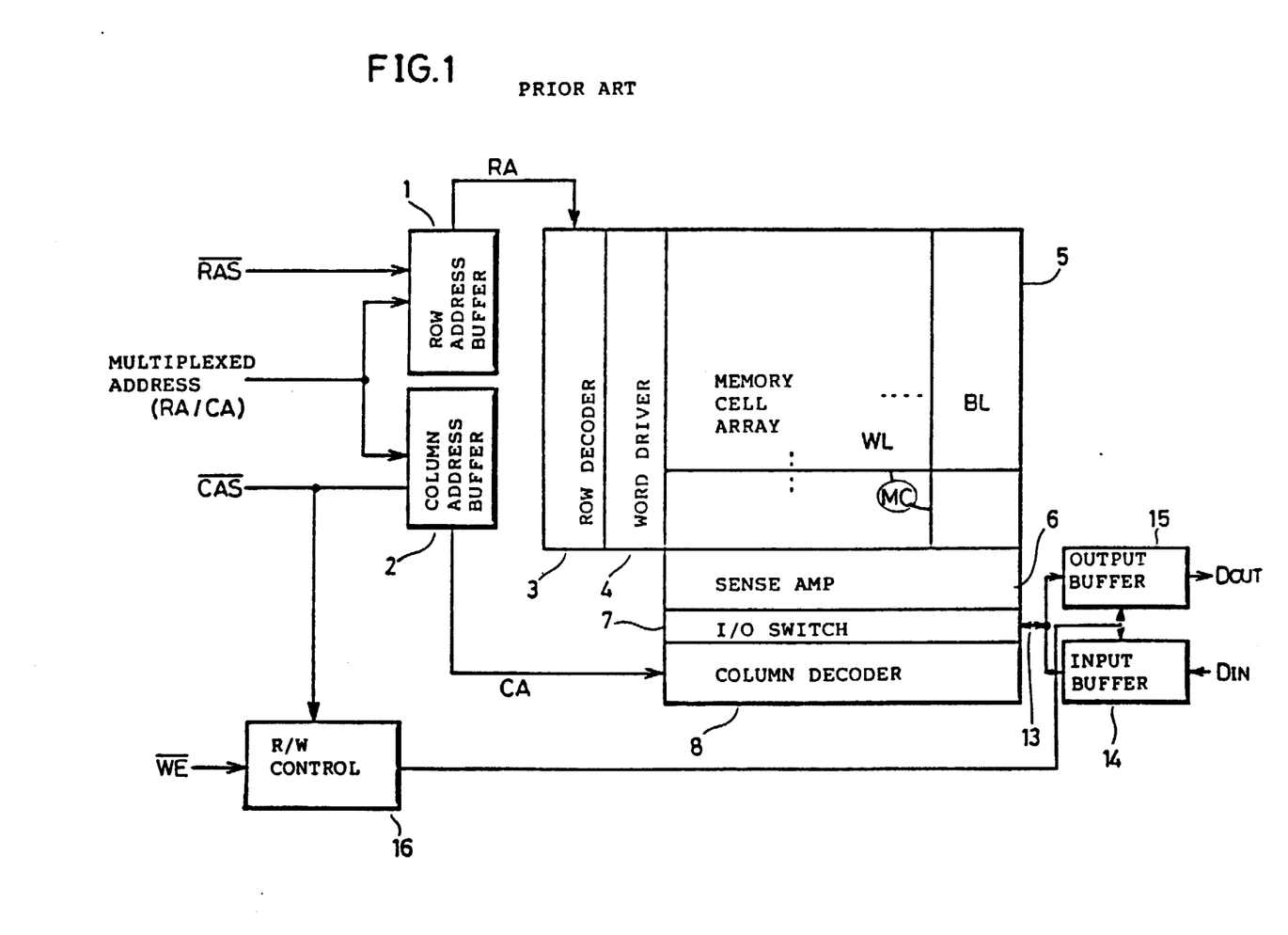
FIG. 1 shows schematically the whole structure of a conventional dynamic random access memory.

Referring now to FIG. 1, description is made of a structure of the DRAM with a fast access mode. The DRAM includes a memory cell array 5 having a plurality of memory devices (memory cells) MC for storing information arranged in a matrix of rows and columns. The rows in the memory cell array 5 is defined by a word line WL and the columns in the memory cell array 5 is defined by a bit line BL. In FIG. 1, a single word line WL, a single bit line BL and a memory cell MC located at an intersection thereof are typically shown. In order to detect, amplify and latch a signal voltage which appeared on the bit line at the time of selecting the word line, there is provided a sense amplifier 6 corresponding to each column in the memory cell array 5.

In order to select memory cells on one row in the memory cell array 5, there are provided a row address buffer 1, a row decoder 3 and a word driver 4. The row address buffer 1 accepts an externally applied row address in response to a control signal $\overline{RAS}$, to generate an internal row address RA. The row decoder 3 decodes the internal row address RA from the row address buffer 1, to designate one word line. The word driver 4 activates the word line designated by a row address decode signal from the row decoder 3 in response to the decode signal.

In order to select memory cells on one column in the memory cell array 5, there are provided a column address buffer 2, a column decoder 8 and an I/O switch 7. The column address buffer 2 accepts an external column address in response to a control signal $\overline{CAS}$, to generate an internal column address CA. The column decoder 8 decodes the internal column address CA from the column address buffer 2, to generate a signal for selecting a column designated by the column address. The I/O switch 7 connects a column (a bit line) designated by a column address decode signal from the column decoder 8 to an I/O bus 13 in response to the decode signal.

In order to input/output data, there are provided an input buffer 14 receiving input data $D_{IN}$ externally applied for generating internal data to apply the same onto the I/O bus 13, and an output buffer 15 receiving through the I/O bus 13 information in the memory cell selected by the row and column addresses for generating external data $D_{OUT}$.

In order to control a data input/output operation of the memory, there is provided an R/W control 16 responsive to a write enable signal $\overline{WE}$ and the signal $\overline{CAS}$ for controlling operations of the data input buffer 14 and the data output buffer 15.

The external address is applied through the same pins by multiplexing the row address and the column address. The control signal $\overline{RAS}$ provides operation timing of a circuit associated with the row address. In addition, the signal $\overline{RAS}$ is activated, so that the memory cycle is started. The signal $\overline{CAS}$ provides operation timing of a circuit associated with column selection. Furthermore; the signal $\overline{CAS}$ provides timing of reading out and writing data, depending on the operation mode. Referring now to waveform diagrams of FIGS. 2 to 4, an operation of the DRAM will be described.

Figure 2:
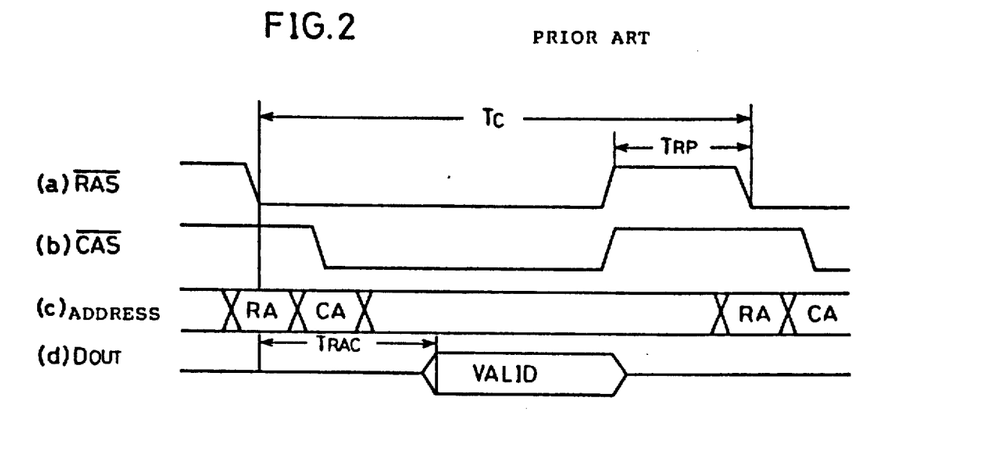
FIGS. 2(a)-2(d) are typical waveform diagrams showing a reading operation in a normal mode of the conventional dynamic random access memory.

Referring now to FIG. 2, description is made on a normal cycle of the DRAM. The signal $\overline{RAS}$ falls to a low level, so that the memory cycle is started. The externally applied row address is accepted in a chip of the DRAM at the falling edge of the signal $\overline{RAS}$. The internal row address is generated from the row address buffer 1, to be applied to the row decoder 3. The row address is decoded by the row decoder 3, so that a single word line is selected through the word driver 4. Consequently, information in memory cells on one row connected to the selected word line are transferred onto each bit line (column). The information on each bit line is detected, amplified and latched by the sense amplifier 6. On the other hand, when the signal $\overline{CAS}$ falls, the externally applied column address is accepted in the column address buffer 2, so that the internal column address CA is generated. The column decoder 8 decodes the internal column address CA, to select a column designated by the column address. The I/O switch 7 connects the column (bit line) selected by the decode signal from the column decoder 7 to the I/O bus 13. Consequently, the information in the selected memory cell detected and latched by the sense amplifier 6 is outputted through the output buffer 15. More specifically, in the normal cycle, the row address is accepted in the chip at the falling edge of the signal $\overline{RAS}$ and then, the column address is accepted in the chip at the falling edge of the signal $\overline{CAS}$. Thereafter, data stored in the memory cell selected by the row address RA and the column address CA is outputted. Thus, the access time (from the time when the signal $\overline{RAS}$ falls to the time when valid data is outputted) requires an RAS access time $T_{RAC}$ shown in FIG. 2. A cycle time Tc is the sum of the time when the DRAM is active (the signal $\overline{RAS}$ is at the low level) and an RAS precharge time (the time when the signal $\overline{RAS}$ is at a high level, during which the device is in a standby state) $T_{RP}$. As a standard value, Tc equals approximately 200 ns in the DRAM with $T_{RAC}$ of 100 ns.

Figure 3:
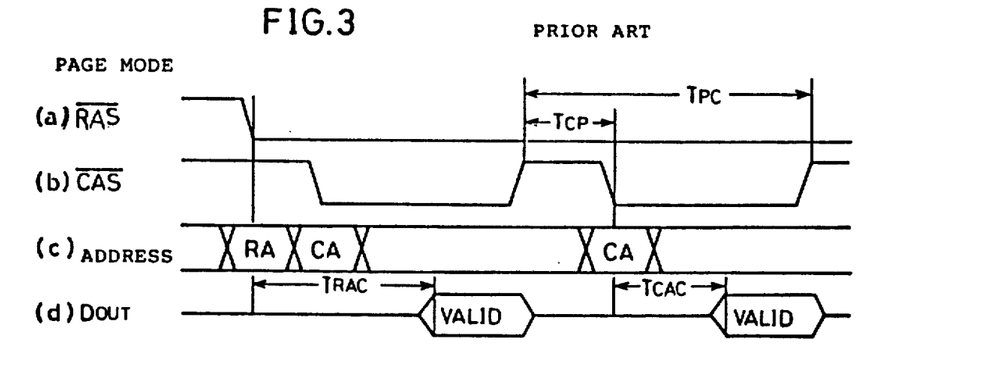
FIGS. 3(a)-3(d) are typical waveform diagrams showing a reading operation in a page mode of the conventional dynamic random access memory.

Referring now to FIG. 3, description is made on a page mode operation. First, in the same manner as in the normal operation cycle, the row address and the column address are applied, so that information in the selected memory cell is read out through the output buffer 15. Then, the signal $\overline{CAS}$ is made high while the signal $\overline{RAS}$ is held at the low level. Consequently, circuits associated with column selection such as the column address buffer 2 and the column decoder 8 are reset. On the other hand, since the signal $\overline{RAS}$ is at the low level, the sense amplifier 6 latches information in memory cells on one row selected by the row address. Then, when the column address is applied and the signal $\overline{CAS}$ is made low, a column (a bit line) corresponding to the column address newly applied is selected, so that information on the column selected by the column decoder 8 and the I/O switch 7 is read out through the I/O bus 13 and the output buffer 15. The operation for accepting a new column address every time the signal $\overline{CAS}$ is toggled is allowed to be repeated many times at the time during the time period when the signal $\overline{RAS}$ is allowed to be held at the low level. More specifically, the page mode operation is an operation for accessing memory cells connected to the same row by changing only the column address. Since only the column address is changed, the row address need not be accepted for each access, so that access is achieved at higher speed than that in the normal operation cycle.

Figure 4:
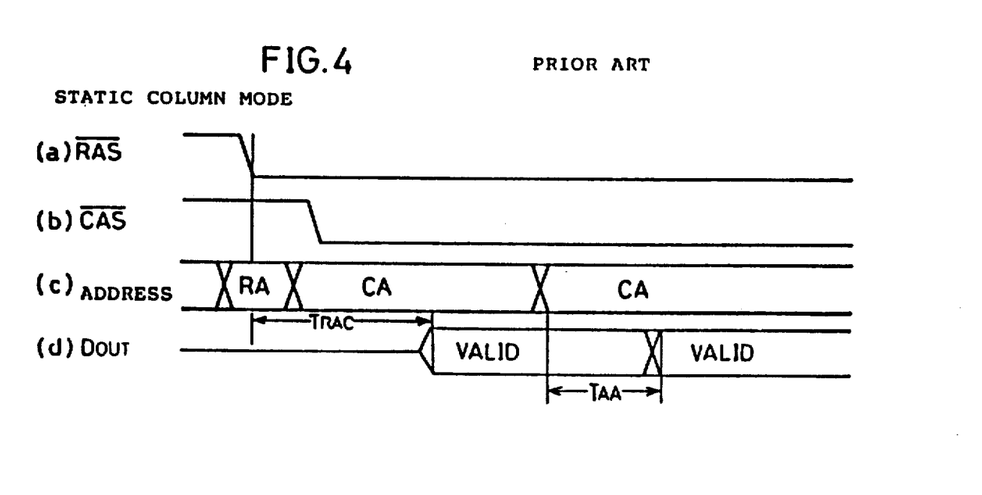
FIGS. 4(a)-4(d) are typical waveform diagrams showing a reading operation in a static column mode of the conventional dynamic random access memory.

Referring now to FIG. 4, description is made on the static column mode. In the static column mode, the first access is the same as that in the normal operation. The row address and the column address are accepted in the chip in response to the signals $\overline{RAS}$ and $\overline{CAS}$, respectively, so that the information in the selected memory cell is read out. After a predetermined time period elapsed from the time when the valid data is read out, the column address is changed while the signals $\overline{RAS}$ and $\overline{CAS}$ are held at the low level. Consequently, information in a memory cell corresponding to a new column address out of the memory cells on the same row is read out. Even in this operation mode, the signal $\overline{RAS}$ is held at the low level, so that information in the memory cells on one row designated by the row address first applied are latched by the sense amplifier. Thus, similarly to the page mode, the static column mode is a mode for accessing memory cells connected to the same row by changing only the column address. However, as in the static RAM, the signal $\overline{CAS}$ is held at the low level (which corresponds to the signal $\overline{CS}$ in the static RAM), access is made only by changing the column address. Thus, the signal $\overline{CAS}$ need not be toggled, so that the access can be made at higher speed than that in the page mode.

The access time in the page mode (from the time when the signal $\overline{CAS}$ falls to the time when valid data is outputted) $T_{CAC}$ and the access time in the static column mode (from the time when the column address is changed from the time when the valid data is outputted) $T_{AA}$ become values of approximately one-half of the RAS access time $T_{RAC}$ in the normal operation, i.e., $T_{AA} \approx 50$ ns for a device with $T_{RAC} = 100$ ns. In addition, the cycle time is shortened. The cycle time in the page mode becomes the same value as that in the static column mode, i.e. approximately 50 ns which may vary depending on the value of the CAS precharge time $T_{CP}$.

A static column mode operation and a cache system employing a DRAM operable in a static column mode are described in an article by J. G. Goodman et al., entitled "The Use of Static Column RAM as a Memory Hierarchy", IEEE 11th Annual Symposium on Computer Architecture, 1984, pp. 167-174.

Figure 5:
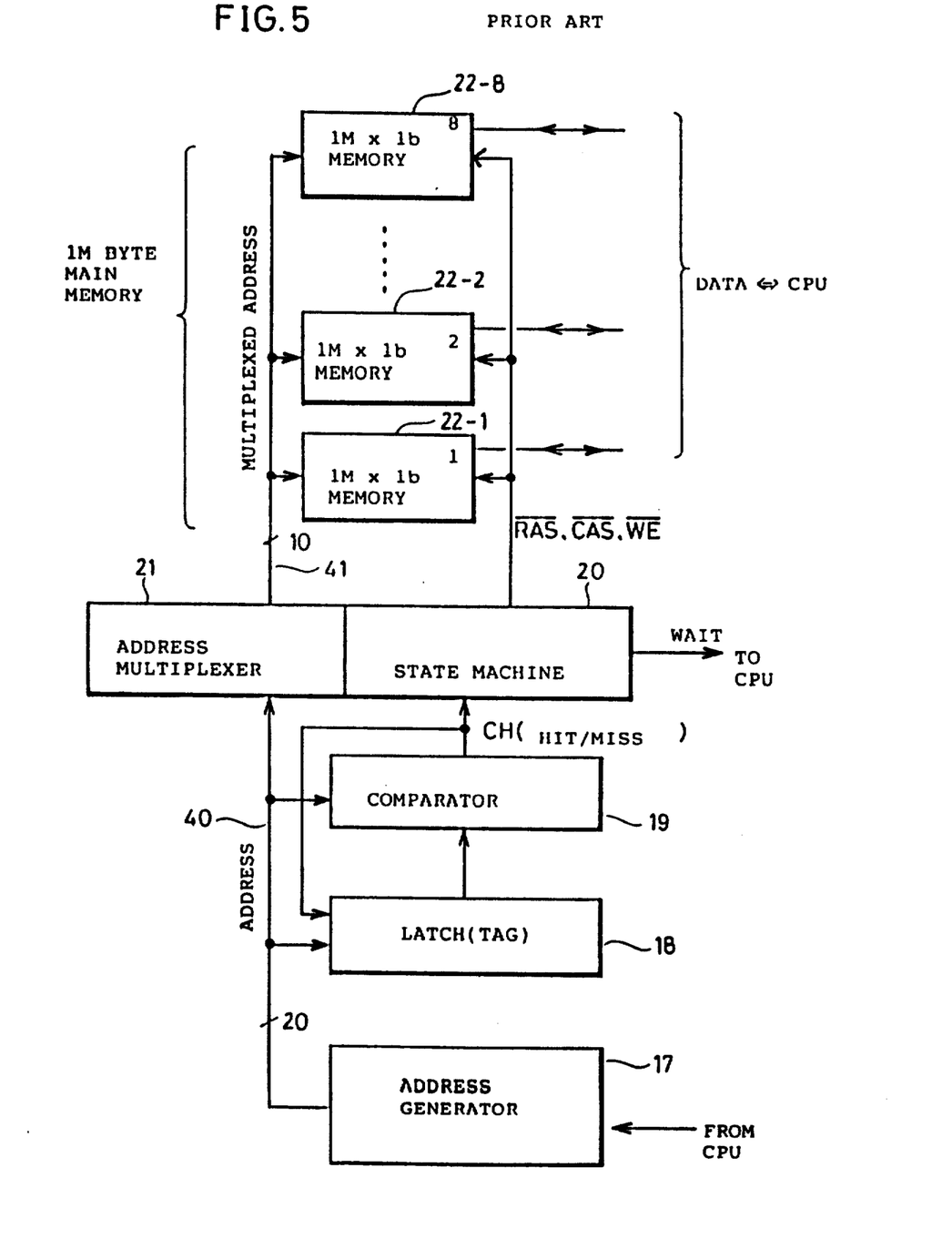
FIG. 5 represents a schematic structure of the conventional simple cache system using the dynamic random access memories operable in a fast serial access mode.

A page mode operation and a ripple mode/static column mode operation and a cache system employing a DRAM which can perform the operations are proposed in Application Note on 256K CMOS DRAM, Intel Corp. pp. 1-276 to 1-279, Referring now to FIG. 5, description is made on structure and an operation of a simple cache memory system utilizing the above described fast serial access mode such as the page mode or the static column mode.

Referring to FIG. 5, the main memory system comprises 8 DRAMs 22-1 to 22-8 which can perform a fast serial access operation. Each of the DRAMs 22-1 to 22-8 has a 1M × 1 b structure. More specifically, each of the DRAMs 22-1 to 22-8 has its capacity of 1 mega bits ($2^{20}$ bits), to or from which data is inputted or outputted bit by bit. Thus, the main memory system has a 1M byte structure. The same address is multiplexed, to be applied to each of the DRAMs 22-1 to 22-8. Thus, a 10-bit address is applied to each of the DRAMs.

In order to control access to the main memory, there are provided an address generator 17, a latch (tag) 18, a comparator 19, a state machine 20 and an address multiplexer 21.

The address generator 17 generates an address of data requested by the CPU (not shown) in response to address information from the CPU. Where the main memory system has a 1M byte structure, 20-bits of the addresses (a 10-bit row address and a 10-bit column address) are simultaneously transferred onto a 20-bit address bus 40.

The latch (tag) 18 stores a row address selected in the previous cycle in response to the address from the address generator 17. The row address stored in the latch (tag) 18 is not rewritten if there is a cache hit, while being rewritten with a row address newly generated from the address generator 17 if there is a cache miss.

The comparator 19 compares the row address from the address generator 17 with the row address stored in the latch (tag) 18, to generate a signal CH (cache hit) indicating the result of comparison. The signal CH is applied to the latch (tag) 18. Consequently, updating of stored contents in the latch (tag) 18 is controlled. The signal CH is also applied to the state machine 20.

The state machine 20 generates control signals $\overline{RAS}$, $\overline{CAS}$ and $\overline{WE}$ in response to the signal CH, to apply the same to each of the DRAMs 22-1 to 22-8. The signal $\overline{WE}$ is a signal for designating input/output of data to/from the main memory system. The signal $\overline{WE}$ designates data reading when it is at the high level while designating data writing when it is at the low level. The signal $\overline{WE}$ is applied to data input buffer and data output buffer in the DRAM. Data is written in response to timing of the later fall of the falls of the signals $\overline{CAS}$ and $\overline{WE}$. When the signal CH from the comparator 19 indicates noncoincidence (cache miss), the state machine 20 once makes the signals $\overline{RAS}$ and $\overline{CAS}$ high and then, sequentially lowers the signals $\overline{RAS}$ and $\overline{CAS}$ to cause the DRAM to perform the normal operation, as well as applies a signal WAIT to the CPU to bring the CPU into waiting state. When the signal CH indicates coincidence (cache hit), the state machine 20 toggles the signal $\overline{CAS}$ with the signal $\overline{RAS}$ being at the low level, to cause the DRAM to perform the page mode operation.

Figure 6:
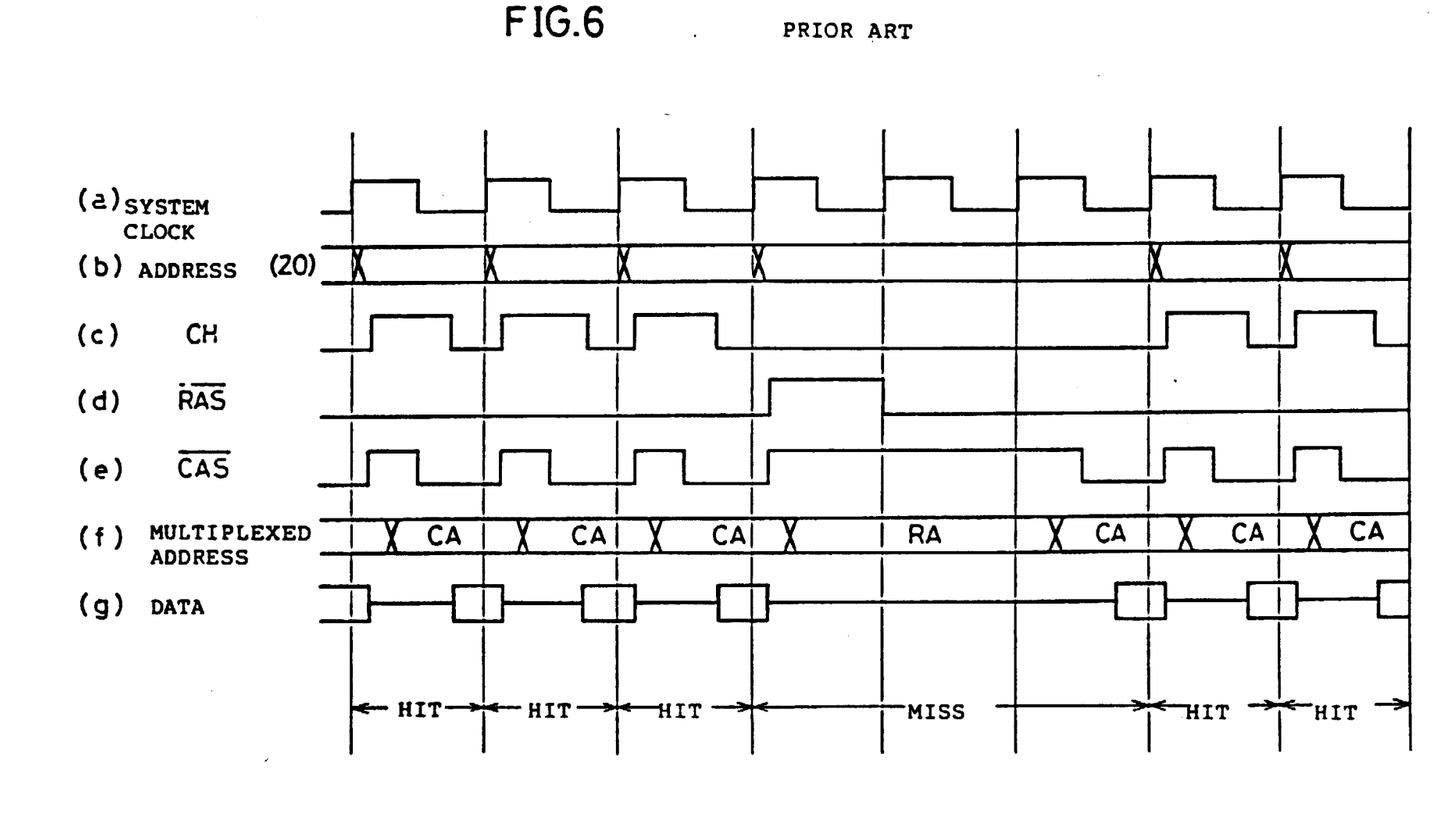

The address multiplexer 21 multiplexes the address from the address generator 17 and transfers the same onto a 10-bit address bus 41, to apply the same to each of the DRAMs 22-1 to 22-8 under the control of the state machine 20. When the signal CH indicates noncoincidence, the address multiplexer 21 multiplexes the 20-bit address applied from the address generator 17, to seqentially generate the 10-bit row address and the 10-bit column address under the control of the state machine 20. When the signal CH indicates coincidence, the address multiplexer 21 generates only the 10-bit column address out of the applied addresses under the control of the state machine 21. Referring now to a waveform diagram of FIG. 6, description is made on the operation of the cache memory system shown in FIG. 5. A system clock shown in FIG. 6 is a clock for providing operation timing of the memory system and the CPU, one clock defining one machine cycle.

As a certain program proceeds, the CPU generates address information of data requested by the CPU. In response thereto, the address generator 17 generates an address indicating the location where the data requested by the CPU is stored in response to the fall of the system clock, to transfer the same onto the 20-bit address bus 40. The comparator 19 compares a 10-bit row address out of generated addresses with the row address stored in the latch (tag) 18. When both coincide with each other, it is indicated that the same row as a row to which the memory cell accessed in the previous cycle belongs is accessed, the comparator 19 generates the signal CH indicating cache hit. The state machine 20 toggles the signal $\overline{CAS}$ with the signal $\overline{RAS}$ being at the low level (the signal $\overline{RAS}$ has been made low until then and each DRAM is in an enable state) in response to the signal CH from the comparator 19. On the other hand, the address multiplexer 21 transfers the 10-bit column address onto the 10-bit address bus 41 under the control of the state machine 20 at the time of generating the signal CH. Consequently, each of the DRAMs 22-1 to 22-8 performs the page mode operation, and outputs data at high speed in an access time of $T_{CAC}$, to apply the same to the CPU (input/output of data is designated by the signal $\overline{WE}$). This designation is provided from the CPU and generated from the state machine 20).

On the other hand, when the row address stored in the latch (tag) 18 and the row address generated by the address generator 17 do not coincide with each other, the comparator 19 does not generate the signal CH (or the signal CH is at the low level). In this case, since memory cells on a different row from the row accessed in the previous cycle are accessed, a row address is newly applied to each of the DRAMs 22-1 to 22-8. The state machine 20 once changes signals $\overline{RAS}$ and $\overline{CAS}$ to the inactive state of the high level in response to the fact that the signal CH is not generated, to cause each of the DRAMs 22-1 to 22-8 to perform the normal operation. The address multiplexer 21 multiplexes the 20-bit address from the address generator 17 to sequentially transfer the 10-bit row address and the 10-bit column address onto the address bus 41 under the control of the state machine 20. Each of the DRAMs 22-1 to 22-8 accepts the row address at the falling edge of the signal $\overline{RAS}$ to select one word line while accepting the column address at the falling edge of the signal $\overline{CAS}$ to select one column, to output information in the selected memory cell.

Thus, on cache miss, the normal operation cycle beginning with the RAS precharge is started. The minimum value of the RAS precharge time is defined, so that the next operation cycle can not be started before a lapse of the RAS precharge time. In addition, the access time elapsed until determined data is outputted becomes $T_{RAC}$ in the operation at low speed. Since this time is longer than the operation cycle of the CPU, the state machine 20 applies to the CPU the signal WAIT for bringing the CPU into the WAIT state until the determined data is outputted. In addition, on cache miss, the latch (tag) 18 stores and holds a new row address on the address bus 40. Determination whether or not the latch (tag) 18 changes the stored contents is controlled in response to the signal CH.

In the above described structure, the latch (tag) 18 stores the row address, and it is determined whether or not the stored row address and a row address to be newly accessed coincide with each other. In other words, in the conventional simple cache memory system, data corresponding to one row in the DRAM (1024 bits in the case of a 1 Mb device) constitutes one block, and it is determined whether cache hit/miss occurs in this data block.

However, the probability that access from the CPU is continuously made to all data in one block (1024 bit/DRAM corresponding to one row in the above described conventional example) is not high, so that the block size (1024 bit/DRAM) is unnecessarily large.

Additionally, in the above described prior art structure utilizing the page mode or the static column mode, the number of blocks (entries) held in the latch (tag) 18 is 1, which can not be made larger, so that a cache hit rate can not be made significantly large.

A dynamic semiconductor memory device comprising a serial shift register having a number of stages equal to the number of columns in the memory cell array and connected to the columns by transfer gates is disclosed in U.S. Pat. No. 4,330,852 entitled "Semiconductor Read/Write Memory Array Having Serial Access", by D. I. Redwine et al., filed Nov. 23, 1979. In this device, data of one row of cells are transmitted in parallel between the shift register and an addressed row of cells. Data in the shift register are serially shifted out of the register to the exterior for a read operation. The device of the prior art comprises a data register which is serially accessed, and thus the device can not be applied to a memory for a cache which requires random access to the columns on an addressed row.

The same device as discussed above is also set forth in a publication entitled "A High Speed Dual Port Memory with Simultaneous Serial and Mode Access for Video Application", by R. Pinkham et al., *IEEE Journal of Solid-State* Circuits Vol. SC-19, No. 6, Dec. 1984, pp. 999-1007.

A memory device with an on-chip cache is disclosed by Matick et al. in U.S. Pat. No. 4,577,293 entitled "Distributed On-Chip Cache", filed Jan. 1, 1984.

This prior art on-chip cache comprises a cell array and a master-slave register. Accessing the cell array is performed through a first port, while accessing the slave register is performed through a second port. The master-slave register is employed as a cache. However, in this prior art, the master register receives data from the columns connected to an addressed row of the cell array. Therefore, this prior art also has disadvantages such as too large data block size and too small entry number in the latch (tag).

SUMMARY OF THE INVENTION

One object of the present invention is to provide a dynamic random access memory device containing a cache memory with an adequate data block size.

Another object of the present invention is to implement a dynamic random access memory device which can provide an increased number of entries stored in the tag in the simple cache system.

A further object of the present invention is to provide a simple cache system with an adequate data block size and an increased entry number to improve the hit rate and cost/performance of the system.

A still further object of the present invention is to provide an operating method therefor.

A dynamic random access memory device of the present invention includes a memory cell array divided into a plurality of cell blocks and a plurality of data storage blocks each provided for each cell block. Each data storage block is operable to receive data on the columns in the corresponding cell block in response to a cache miss indicating signal. Each data storage block is also operable to output therefrom data corresponding to data on a selected column in response to a cache hit signal.

According to the above described structure, different data storage blocks can store data of different rows on plural data bits basis so that the number of entries in a simple cache system is increased in correspondence with the number of the data storage blocks. In addition, the data block size of the simple cache system is reduced to be an adequate size depending on the size of the data storage blocks.

These objects and other objects, features, aspects and advantages of the present invention will become more apparent from the following detailed description of the present invention when taken in conjunction with the accompanying drawings.

BRIEF DESCRIPTION OF THE DRAWINGS

FIGS. 6 (a)-(g) are operation waveform diagrams for the simple cache system as shown in FIG. 5;

DESCRIPTION OF THE PREFERRED EMBODIMENTS

Figure 7:
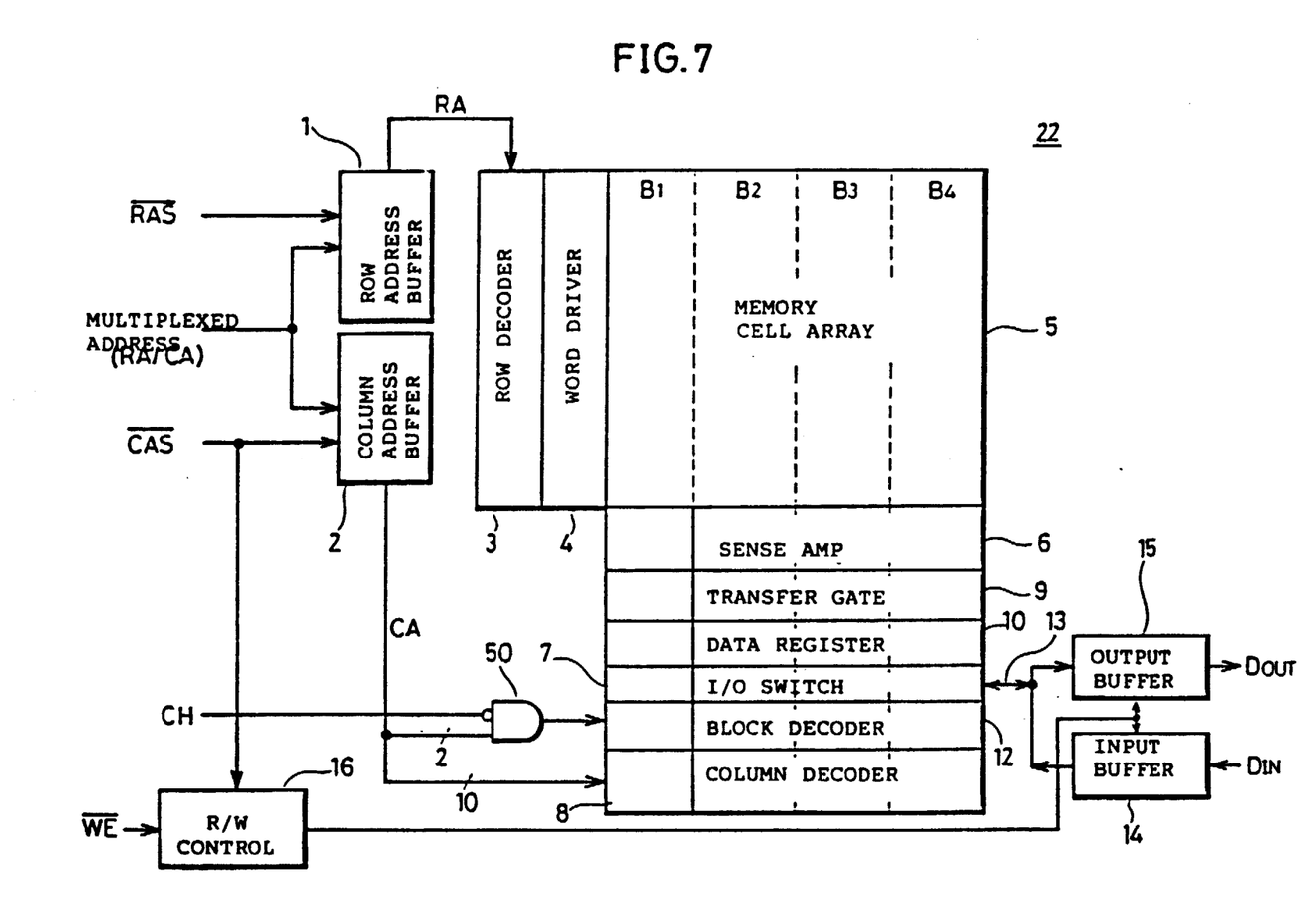
FIG. 7 represents a schematic structure of the dynamic random access memory according to one embodiment of the present invention.

FIG. 7 shows a schematic structure of the whole of a semiconductor memory device containing a cache according to an embodiment of the present invention. Components corresponding to those in the memory device shown in FIG. 1 have the same reference numerals. A memory device 22 includes a memory cell array 5 divided into four blocks B1, B2, B3 and B4. In other words, one row (or a word line) in the memory cell array 5 is divided into four blocks B1 to B4. In order to select one block from the four blocks B1 to B4 in the memory cell array 5, there is provided a block decoder 12. There are provided, between the block decoder 12 and the memory cell array 5, a transfer gate 9 responsive to a block select signal from the block decoder 12 to be turned on for transferring data on a plurality of columns in the selected block and a data register 10 for latching data transferred through the transfer gate 10.

There is provided an I/O switch (a column selection switch) 7 responsive to an output of a column decoder 8 to be turned on, between the data register 10 and a data input/output line 13.

In order to control an operation of the block decoder 12, there is provided an AND gate 50 having a false input receiving a cache hit signal and a true input receiving a part of a column address (a block select address; 2 bit in the case for 4 blocks). Thus, the AND gate 50 is disabled on cache hit, while being enabled on cache miss to apply the block select address to the block decoder 12.

The block decoder 12 decodes the block select address from the AND gate 50, to generate a signal for selecting one block.

The transfer gate 9 operates on a block basis. More specifically, transfer gates connected to the selected block are rendered conductive in response to a block select signal from the block decoder 12.

The data register 10 is provided with each column in the memory cell array 5. The data register 10 latches the data amplified and detected by the sense amplifier received through the transfer gate which is conductive. Thus, on cache miss, data in the block selected by the block decoder 12 are latched in a data register corresponding to the selected block, and the previous data are updated. On the other hand, on cache hit, the block decoder 12 does not operate, and the transfer gate 9 is non-conductive.

The column decoder 8 decodes an applied column address CA, to select one column in the memory cell array 5. A column select signal from the column decoder 8 is applied to the I/O switch 7, so that the selected column is connected to the data input/output line 13.

In the above described configuration, on cache hit, data is read out from a data register isolated from the memory cell array 5. On the other hand, on cache miss, data latched by a sense amplifier connected to a selected column is read out. At the same time, data in the data register provided corresponding to the selected block is updated in response to data, on each column in the selected block, latched by the sense amplifiers.

Figure 8:
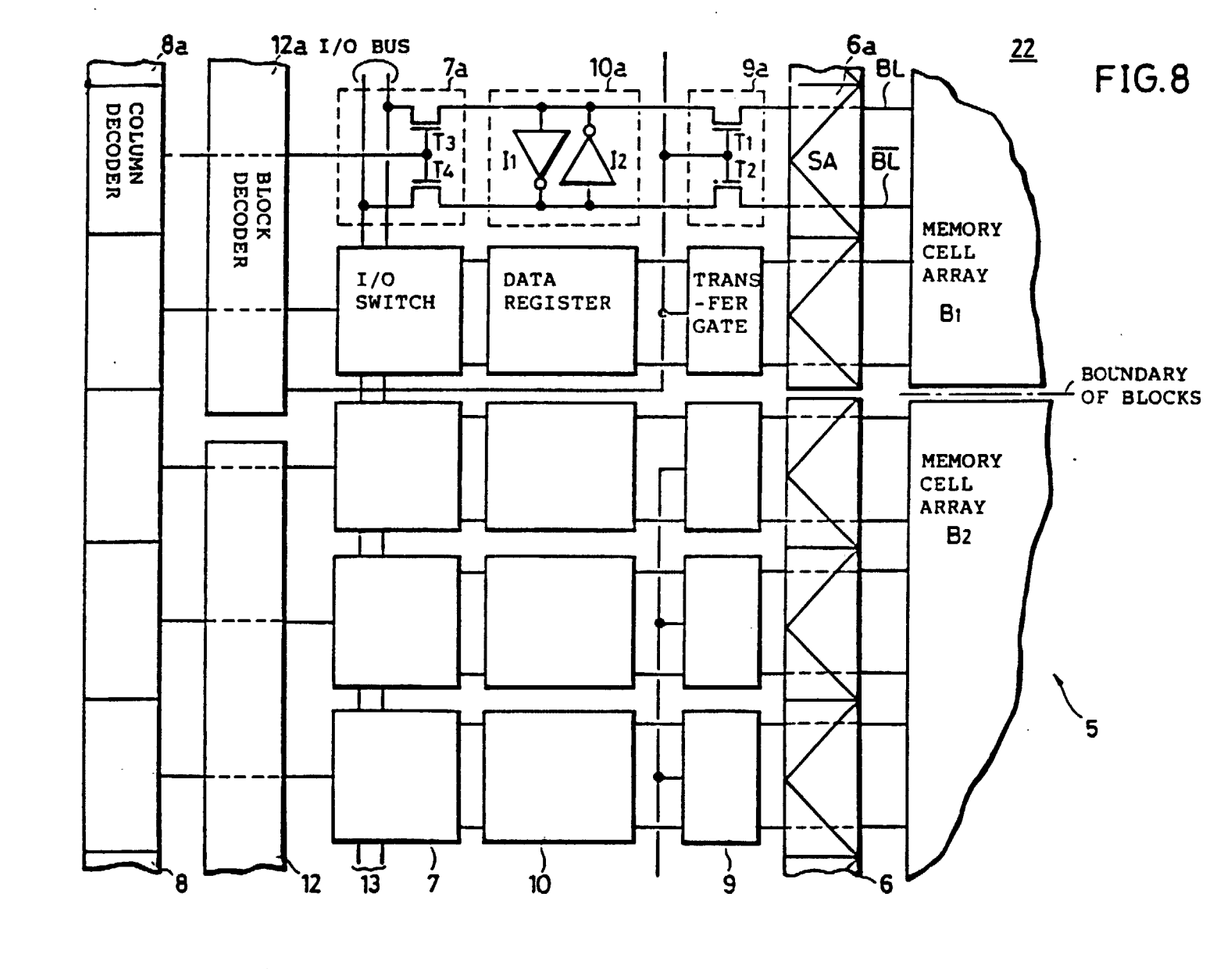
FIG. 8 represents a structure of the main part of the dynamic random access memory as shown in FIG. 7.

Referring to FIG. 8, main portions of the memory device according to the present invention are schematically shown. In FIG. 8, only components associated with a part of the blocks B1 and B2 are shown.

A column in the array 5 consists of a pair of bit lines BL and $\overline{BL}$ forming a folded bit line structure. Each pair of bit lines is provided with a unit sense amplifier 6a for amplifying and latching a differential signal voltage on the corresponding pair of bit lines.

In addition, each pair of bit lines is provided with a unit transfer gate 9a, unit data register (or data latch) 10a and a unit I/O switch 7a.

A unit transfer gate 9a comprises two switching transistors T1 and T2 which turn on in response to a block select signal from a selected unit block decoder 12-1 or 12-2, . . . .

The unit register 10a comprises two inverters 11 and 12 which are connected in antiparallel between the corresponding pair of bit lines BL and $\overline{BL}$.

The unit I/O switch 7a comprises two switching transistors T3 and T4 which turn on in response to a column select signal from a selected column decoder 8a.

A block select signal from a unit block decoder 12a is transferred to the gates of the unit transfer gates 9a connected to the columns in the corresponding memory cell array block (B1 or B2, . . . ).

According to the structure of FIG. 8, on cache hit, each block decoder 12a is not activated, and therefore the transfer gate 9 (or all of the unit transfer gates 9a) keeps an off-state to isolate the cell array 5 from the data register 10. A column address is applied to the column decoder 8 to select a unit decoder 10a when the signal $\overline{CAS}$ goes low. Then, a unit I/O switch 7a connected to the selected unit column decoder 8a turns on to transfer the data stored in the unit register 10a connected thereto onto the data input/output bus 13.

On cache miss, the block decoder 12 is activated to select a block according to the received block select address (a part of the column address). Then, the unit transfer gates 9a connected to the columns in the selected block are turned on to connect the unit data registers 10a and the unit sense amplifiers 6a. Then, data latched by the unit sense amplifiers in the selected block are transferred in parallel to the unit data registers 10a. At the same time, one unit I/O switch 7a is turned on in response to the column select signal from a selected unit column decoder 8a. Thus, data of the selected memory cell is read out through the data input/output bus 13.

As described above, the data register 10 can store data of different tags for different blocks. Therefore, when the memory device according to the present invention is applied to a simple cache memory, the number of entries in the latch (tag) can be increased without any complicated additional circuitry. Also the block size is reduced to be an adequate size. Thus, a simple cache memory system is achieved with superior cost performance and an improved cache hit rate.

Figure 9:
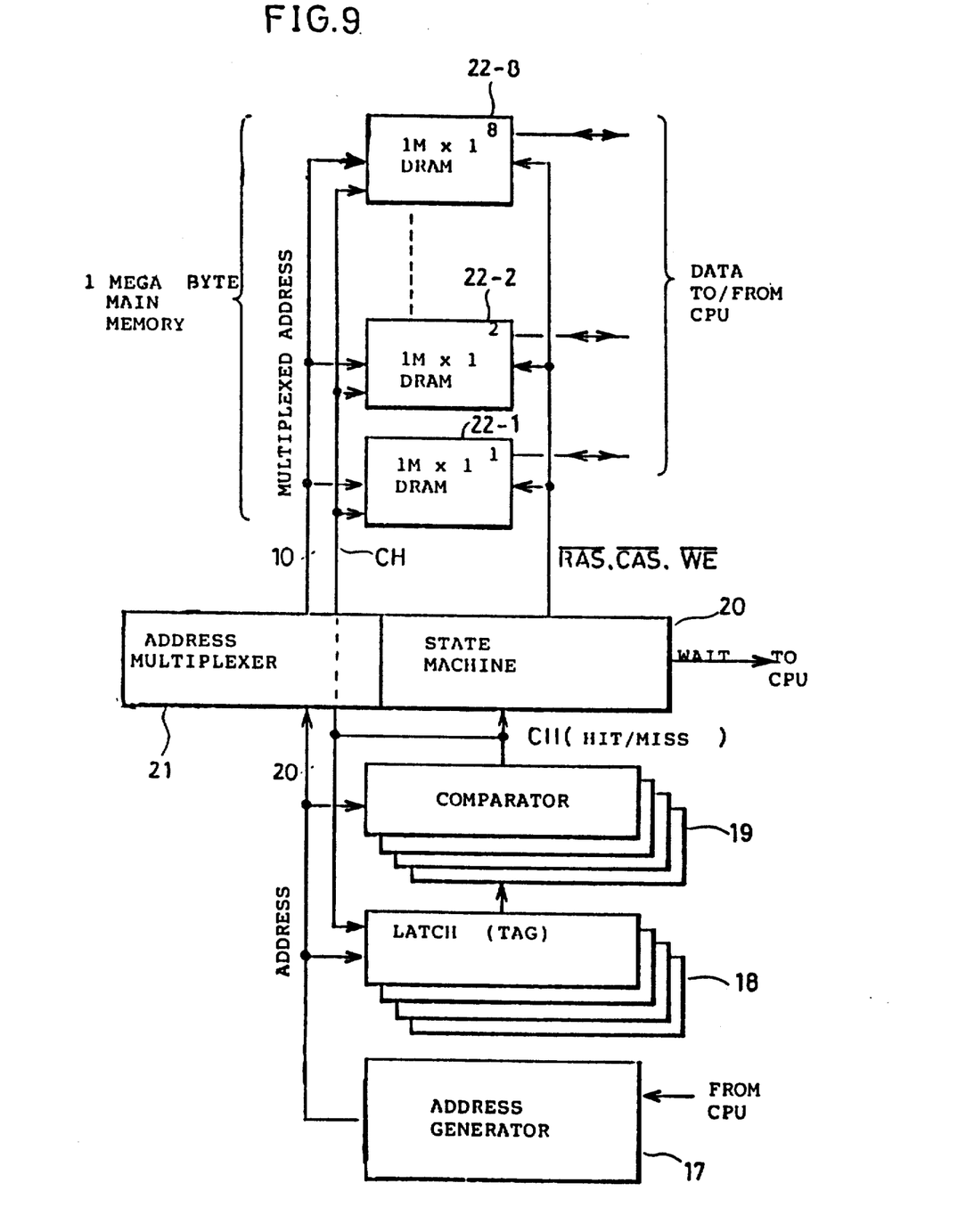
FIG. 9 represents schematically a structure of the simple cache system utilizing the dynamic random access memories of the present invention.

FIG. 9 represents schematically the whole structure of the simple cache memory system according to the present invention. In the system, 8 DRAMs each having a 1 mega bits $\times$ 1 bit structure are employed to provide a main memory of a capacity of 1 mega bytes (1M bits $\times$ 8 bits). Each DRAM has the same structure as shown in FIGS. 7 and 8. The latch (tag) 18 comprises 4 blocks each storing an address tag (a row address plus a part of a column address) in accordance with 4 cell blocks in each of the DRAMs 22-1 to 22-8.

The comparator 19 compares an address tag from the address generator 17 with 4 address tags stored in the latch (tag) 19 at a time.

The cache hit signal CH is applied to the 8 DRAMs as well as the latch (tag) 18.

The address generator 17 issues a 20-bit address of a 10-bit row address and a 10-bit column address in response to address information from the CPU (not explicitly shown). The 20-bit address is applied to the address multiplexer 21. An address tag of the 10-bit row address and a predetermined part of the 10-bit column address (for example, 2-bits of 10 bit column address in the case of 4 cell blocks) is applied to the comparator 19 and the latch (tag) 18.

The latch (tag) 18 stores address tags accessed in the previous memory cycle and/or an address tag frequently requested to access by the CPU. The frequently accessed address tag is determined depending on a system configuration or application thereof. An operation of the simple cache memory system is described with reference to FIGS. 6 to 9, in the following.

The signal $\overline{RAS}$ is at a low level, and one row in each DRAM selected in the previous memory cycle is held in an active state. Thus, data accessed in the previous cycle are latched in the sense amplifier 6 in each DRAM 22-1 to 22-8.

Then, the address generator 17 produces a 20-bit address at a rising edge of the system clock in response to address information from the CPU. The address tag of the 10-bit row address and a 2-bit block select address (a part of the 10-bit column address) is applied to the comparator 19 and the latch (tag) 18. The latch 18 does not strobe the newly received address tag yet. The comparator 19 compares the received address tag with the address tags stored in the latch (tag) 18. When coincidence between the newly generated address tag and one of the stored address tags is detected by the comparator 19, the signal CH indicative of cache hit is issued to be applied to the state machine 20 and the latch (tag) 18 and also to the DRAMs 22-1 to 22-8.

The state machine 20 toggles the signal $\overline{CAS}$ holding the signal $\overline{RAS}$ at the low level to apply the DRAMs. At the same time, the address multiplexer 21 applies to the DRAMs the 10-bit column address out of the received 20-bit address under the control of the state machine 20. In each DRAM 22-1 to 22-8, the block decoder 12 can not receive the block select address by a function of the gate 50 which is in turn disabled in response to the cache hit signal CH. Thus, the transfer gate 9 in each DRAM 22-1 to 22-8 maintains the turned-off state to isolate the data register 10 from the memory cell array 5. Then, the column decoder 8 decodes the received 10-bit column address to select one column (or more precisely, one unit I/O switch). Thus, data in the unit data register connected to the selected unit I/O switch is transferred onto the data input/output line 13 to be read out through the output buffer 15. As described above, output data can be obtained rapidly from the data register 10 in an access time of $T_{CAC}$ as in the page mode.

On the other hand, when the comparator 19 can not detect coincidence between the received new address tag and the contents of the latch (tag) 18, it does not issue the cache hit signal CH, indicating cache miss. In response thereto, the state machine 20 determines that cache miss occurs, to provide the $\overline{RAS}$ and $\overline{CAS}$ control as in the normal mode and also provide a WAIT signal to the CPU. More specifically, the signal $\overline{RAS}$ is once made high and then made low. The signal $\overline{CAS}$ is made low in a predetermined time after the signal $\overline{RAS}$ is made low. The address multiplexer 21 applies a 10-bit multiplexed address to the DRAMs in the sequence of row address and then column address under the control of the state machine. In each DRAM 22-1 to 22-8, one row and one column are selected in accordance with the received multiplexed address in response to the signals $\overline{RAS}$ and $\overline{CAS}$, respectively. At the same time, the gate 50 in each DRAM 22-1 to 22-8 is enabled to provide to the block decoder 12 the block select address included in the column address. The block decoder 12 decodes the received block select signal to turn on the unit transfer gates 9a connected to the selected cell block. Then, data latched by the unit sense amplifiers 6a in the selected cell block are transferred to the corresponding unit data registers (or data latch) in parallel to be latched therein. One of the data in the selected block is read out onto the data input/output bus 13 through the unit I/O switch which is in turn made conductive by the column select signal from the column decoder 8 in accordance with the column address. As described hereinbefore, the access time on cache miss is $T_{RAC}$, and therefore data is read out at a lower speed than the operating speed of the CPU. Thus, the CPU is in a waiting state in response to the instruction WAIT from the state machine 20.

On cache miss, the latch (tag) 18 replaces one stored address tag with the newly received address tag in response to the fact that the cache hit signal CH is not generated.

Any structure of the latch described above can be employed to provide the same effect.

The comparator 19 can be implemented, for example, by use of conventional comparators each receiving the corresponding address tag from the latch 18 and the newly generated address tag and an OR gate receiving the outputs of the conventional comparators to produce the signal CH.

Furthermore, although the memory cell array is divided into four blocks in the above described embodiment, the number of the blocks is not limited thereto, and any other number of the blocks can be employed to provide the same effect.

Still further, although 8 DRAMs each having a structure of 1 Mb×1 bit are employed to provide 1M byte main memory, any other number of DRAMs with another structure may be used for the main memory to provide the same effect.

As described in the foregoing, according to the present invention, a memory cell array is divided into a plurality of blocks, and a data register for holding data on columns in each block is provided for each block. Thus, information on a plurality of columns of different rows can be held in the data register. In appropriate application to a cache unit, if the data register is employed as a chache memory, a suitable data block size and the increased number of entries can be provided, so that a cache hit rate of the cache unit can be increased, whereby a simple cache system having high cost/performance is achieved.

Furthermore, on cache miss, column information in the selected block are transferred in parallel in a block basis to a data register corresponding to the block simultaneously with a normal mode operation, so that the contents of a data block in the data register can be rewritten at high speed.

Additionally, on cache hit, data are read out by making access to the data register, so that data can be read out without degrading high-speed characteristics of a fast serial access mode in the DRAM.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device for use in a cache system including a generator for generating a cache hit/miss indicating signal, comprising:
   a memory cell array comprising a plurality of memory cells arranged in a matrix of rows and columns, word lines corresponding to said rows, said memory cell array divided into a plurality of memory cell blocks each corresponding to a grouping of columns;
   sense amplifier means for amplifying and latching data of a row of memory cells corresponding to a selected word line;
   cache storage means, separate from said sense amplifier means, and provided for each said memory cell block for storing data of the corresponding cell block;
   said generator generating a cache hit indicating signal when an externally applied address matches an address related to information in the cache storage means and generating a cache miss indicating signal when no such match occurs;

first means for accessing data, corresponding to an externally applied column address, from said cache storage means in response to said cache hit indicating signal;

second means for directly accessing data from said memory cell array in response to said cache miss indicating signal and externally applied row and column address, said second means including transfer means for transferring data from a block of said memory cell array to said cache storage means; and third means responsive to said cache miss indicating signal, said third means including means for controlling the data transfer operation of said transfer means in response to a part of said externally applied column address, wherein only a part of data on said row corresponding to the selected word line in said memory cell array is transferred through said transfer means.

2. A semiconductor memory device in accordance with claim 1, wherein said first means for accessing data comprises;

isolating means responsive to said cache hit signal for isolating said data storage means from said memory cell array;

selecting means responsive to an externally applied column address for selecting at least one column;

means for reading out data from the corresponding position of said data storage means in response to the column select signal from said selecting means.

3. A semiconductor memory device in accordance with claim 1, wherein said cache storage means comprises a plurality of data latches each provided for each column in said memory cell array.

4. A semiconductor memory device containing a cache memory therein for use in a cache system including a generator for generating a cache hit/miss indicating signal, comprising:

a memory cell array comprising a plurality of memory cells arranged in a matrix of rows and columns, said memory cell array divided into a plurality of memory cell blocks each corresponding to a grouping of columns;

cache storage means provided for each said memory cell block for storing data of the corresponding cell block;

said generator generating a cache hit indicating signal when an externally applied address matches an address related to information in the cache storage means and generating a cache miss indicating signal when no such match occurs;

first means for accessing data, corresponding to an externally applied column address, from said cache storage means in response to said cache hit indicating signal;

second means for directly accessing data from said memory cell array in response to said cache miss indicating signal; and means responsive to said cache miss indicating signal for transferring data from one of said memory cell blocks to the corresponding cache storage means to replace the data therein, and wherein said second means comprises:

means for selecting a cell block in response to a block select signal included in an externally applied column address, said means being activated in response to said cache miss signal;

means for connecting the selected cell block to the corresponding block of said data storage means in response to the block select signal from said block selecting means; and means responsive to the externally applied column address for selectively reading out data from the corresponding position in the selected block of said data storage means.

5. A semiconductor memory device in accordance with claim 4, wherein said means for connecting comprises a plurality of transfer gate transistors each provided for each column in the memory cell array to be turned on and off in response to said block select signal.

6. A semiconductor memory device containing a cache memory therein for use in a cache system including a generator for generating a cache hit/miss indicating signal, comprising:

a memory cell array comprising a plurality of memory cells arranged in a matrix of rows and columns, said memory cell array divided into a plurality of memory cell blocks each corresponding to a grouping of columns;

cache storage means provided for each said memory cell block for storing data of the corresponding cell block;

said generator generating a cache hit indicating signal when an externally applied address matches an address related to information in the cache storage means and generating a cache miss indicating signal when no such match occurs;

first means for accessing data, corresponding to an externally applied column address, from said cache storage means in response to said cache hit indicating signal;

second means for directly accessing data from said memory cell array in response to said cache miss indicating signal; and means responsive to said cache miss indicating signal for transferring data from one of said memory cell blocks to the corresponding cache storage means to replace the data therein, and wherein said first means for accessing data comprises:

isolating means responsive to said cache hit signal for isolating said data storage means from said memory cell array;

selecting means responsive to an externally applied column address for selecting at least one column; and means for reading out data from the corresponding position of said data storage means in response to the column select signal from said selecting means, and wherein said isolating means comprises a plurality of transfer gate transistors each provided for each column in the memory cell array; and means for turning off all of said transfer gate transistors in response to said cache hit signal.

7. A semiconductor memory device containing a cache memory for use in a cache system including a generator for generating a cache hit indicating signal and a cache miss indicating signal respectively indicating whether or not data in said cache memory is requested to be accessed, said device comprising:

a memory cell array comprising a plurality of memory cells arranged in a matrix of rows and columns, said memory cell array divided into a plurality of memory cell blocks each corresponding to a group of columns;

row selecting means for selecting one row in said memory cell array in response to an externally applied row address;

column select signal generating means for generating a column select signal for selecting at least one column in said memory cell array in response to an externally applied column address, said column address including a block select address for selecting a cell block;

means provided for each column in said memory cell array for amplifying and latching data in said memory cell array after selection of one row by said row selecting means;

cell block selecting means for selecting a cell block in response to said block select address, said cell block selecting means being activated in response to said cache hit indicating signal and being deactivated in response to said cache miss indicating signal;

data storing means provided for each said column for storing data;

means provided for each said column between said amplifying and latching means and said data storing means for transferring the latched data in response to said block select signal when said cache hit indicating signal is generated, whereby data in the cell block including the selected column are transferred onto the data storing means provided correspondingly for the selected block, and also for isolating said memory cell array from said data storing means under the control of said block selecting means when said cache miss indicating signal is generated;

means provided for each said column between said data storing means and a data output/input bus for transferring data stored in said data storing means onto said data output/input bus when said cache hit indicating signal is generated and for transferring data latched by said amplifying and latching means onto said data input/output bus when the cache miss indicating signal is generated.

8. A method for operating a semiconductor memory device comprising a plurality of cell blocks in a memory cell array in which a plurality of memory cells are arrayed in a matrix of rows and columns each of said cell blocks including a group of memory cell columns and a plurality of data latches provided corresponding to said columns and separated from a plurality of sense amplifiers each for amplifying and latching data on the corresponding column, said memory device being used in a cache system including a cache hit indicating signal indicating whether at least one of data stored in said data latches is requested to be accessed, and a cache miss indicating signal indicating that no data stored in said data latches is requested to be accessed said method including the steps of:

isolating said plurality of data latches from said plurality of sense amplifiers in response to said cache hit indicating signal;

in response to said cache miss indicating signal: activating a selected row of memory cells, amplifying and latching data of all cells of the selected row and selecting a cell block of said plurality of cell blocks to transfer the data latched by said sense amplifiers corresponding to the selected block, to replace the contents of the data latches with the transferred data, in accordance with a block select address included in an externally applied column address and accessing replaced data latched by at least one of said sense amplifiers; and accessing data stored in at least one of the data latches provided for said selected block in response to said externally applied column address when said cache hit indicating signal is received.

9. A semiconductor memory device comprising:

a memory cell array comprising a plurality of memory cells arranged in a matrix of rows and columns, said memory cell array being divided into a plurality of memory cell blocks each corresponding to a group of columns;

a plurality of sense amplifier means, each sense amplifier means for amplifying data in a selected memory cell in a corresponding column;

a plurality of first transfer means, each first transfer means for transferring data amplified by a corresponding one of said sense amplifier means;

a plurality of data storing means, each data storing means receiving and storing data from a corresponding one of said first transfer means;

a plurality of second transfer means, each second transfer means for transferring data stored by a corresponding one of said data storing means to output means;

block selecting means receiving a part of a column select signal, and, in response thereto, for enabling one group of said plurality of first transfer means corresponding to one of said memory cell blocks upon receipt of a cache miss indicating signal and for disabling all of the first transfer means upon receipt of a cache hit indicating signal; and a column selecting means receiving at least part of said column select signal, and for enabling said second transfer means in correspondence therewith.

10. A semiconductor memory device comprising:

a memory cell array including a plurality of memory cell blocks, each said memory cell block having a plurality of memory cells arranged in a matrix of rows and columns;

a plurality of sense amplifier means provided for each said memory cell block, each said sense for amplifier means amplifying data in a selected memory cell in an associated column;

a plurality of first transfer means each for transferring data amplified by a corresponding one of said sense amplifier means;

a plurality of data storing means each for receiving and storing data received from a corresponding one of said first transfer means;

a block selecting means receiving a part of a column select signal, and, in response thereto, for enabling one group of said plurality of first transfer means corresponding to one of said memory cell blocks upon receipt of a cache miss indicating signal and for disabling all of the first transfer means upon receipt of a cache hit indicating signal;

a plurality of second transfer means each for transferring data stored in a corresponding one of said data storing means to data output means; and a column selecting means receiving at least a part of said column select signal, and for enabling second transfer means in correspondence therewith.

* * * * *